(12) United States Patent
Akano

(10) Patent No.: US 8,986,458 B2
(45) Date of Patent: Mar. 24, 2015

(54) PLASMA PROCESSING APPARATUS

(71) Applicant: Chugai Ro Co., Ltd., Osaka-shi, Osaka (JP)

(72) Inventor: Shinya Akano, Osaka (JP)

(73) Assignee: Chugai Ro Co., Ltd., Osaka (JP)

( * ) Notice: Subject to any disclaimer, the term of this patent is extended or adjusted under 35 U.S.C. 154(b) by 0 days.

(21) Appl. No.: 14/233,669

(22) PCT Filed: Jun. 20, 2013

(86) PCT No.: PCT/JP2013/066976
§ 371 (c)(1),
(2) Date: Jan. 17, 2014

(87) PCT Pub. No.: WO2014/027508
PCT Pub. Date: Feb. 20, 2014

(65) Prior Publication Data
US 2014/0238301 A1 Aug. 28, 2014

(30) Foreign Application Priority Data

Aug. 15, 2012 (JP) .................................. 2012-180141

(51) Int. Cl.
*C23C 16/00* (2006.01)
*C23C 14/00* (2006.01)
*C23F 1/00* (2006.01)
(Continued)

(52) U.S. Cl.
CPC ........... *H01J 37/32669* (2013.01); *C23C 14/32* (2013.01); *C23C 14/54* (2013.01); *H05H 1/26* (2013.01); *H01J 37/32009* (2013.01);
(Continued)

(58) Field of Classification Search
CPC ............. H01J 37/321; H01J 37/32357; H01J 37/32082; C23C 16/455; C23C 16/15591
USPC ................. 118/726, 727, 723 IR; 156/345.35
See application file for complete search history.

(56) References Cited

U.S. PATENT DOCUMENTS 3,562,141 A 2/1971 Morley
4,778,561 A * 10/1988 Ghanbari ........................ 216/70
(Continued)

FOREIGN PATENT DOCUMENTS

CN 1135538 A 11/1996
CN 1424428 A 6/2003
(Continued)

OTHER PUBLICATIONS

English translation JP 07-254315, Ogino, Mar. 1995.*

*Primary Examiner* — Keath Chen
(74) *Attorney, Agent, or Firm* — Birch, Stewart, Kolasch & Birch, LLP

(57) ABSTRACT

The present invention provides a plasma processing apparatus capable of bringing plasma close to a processing target and separating the plasma from the processing target. The plasma processing apparatus 1 according to the present invention has a chamber internally having a holding space 2a in which a processing target object 5 is held, and a plasma space 2b in which plasma is to be formed, a plasma gun 3 for emitting electrons into the plasma space 2b to form the plasma, and at least one pair of position-adjustable opposed magnets 4 for forming a magnetic flux passing across the chamber 2, between the holding space 2a and the plasma space 2b.

11 Claims, 2 Drawing Sheets

(51) Int. Cl.
  *H01L 21/306* (2006.01)
  *H01J 37/32* (2006.01)
  *C23C 14/32* (2006.01)
  *C23C 14/54* (2006.01)
  *H05H 1/26* (2006.01)

(52) U.S. Cl.
  CPC ....... *H01J37/32651* (2013.01); *H01J 37/3266* (2013.01); *H01J 37/32357* (2013.01)
  USPC .................. 118/726; 118/723 IR; 204/192.1; 156/345.35

(56) References Cited

U.S. PATENT DOCUMENTS

| | | |
|---|---|---|
| 5,656,141 A | 8/1997 | Betz et al. |
| 5,677,012 A | 10/1997 | Sakemi et al. |
| 6,334,405 B1 | 1/2002 | Takahara et al. |
| 2003/0006008 A1* | 1/2003 | Horioka et al. .......... 156/345.46 |
| 2003/0104142 A1 | 6/2003 | Murakami et al. |
| 2004/0110388 A1 | 6/2004 | Yan et al. |
| 2009/0294281 A1 | 12/2009 | Moriwaki et al. |
| 2012/0298041 A1* | 11/2012 | Zinsstag et al. ............... 118/726 |

FOREIGN PATENT DOCUMENTS

| | | |
|---|---|---|
| CN | 1711621 A | 12/2005 |
| CN | 1929091 A | 3/2007 |
| EP | 0 463 230 A | 1/1992 |
| JP | 4-329637 A | 11/1992 |
| JP | 7-254315 A | 10/1995 |
| JP | 11-213869 A | 8/1999 |
| JP | 4074370 B2 | 4/2008 |
| JP | 2011-246777 A | 12/2011 |
| TW | I242049 B | 10/2005 |
| TW | 200823307 A | 6/2008 |

* cited by examiner

PLASMA PROCESSING APPARATUS

BACKGROUND OF THE INVENTION

1. Field of the Invention

The present invention relates to a plasma processing apparatus.

2. Description of Related Art

For example, as disclosed in JP 4074370 B, there is a known vapor deposition apparatus using a plasma assisted method in which plasma is formed to accelerate vapor deposition. The plasma can accelerate a chemical reaction of a vapor deposition material of a vapor deposition film. However, when the plasma comes in contact with a vapor deposition target body in which the vapor deposition film is formed on its surface, a phenomenon called a bombardment effect is caused so that the material on the surface of the vapor deposition target body is bombarded. In order to clean the surface of the vapor deposition target body (processing target), the bombardment effect with the plasma is positively used in some cases.

A plasma gun which emits electrons with a plasma gas to form the plasma has a convergent coil for forming a magnetic flux to guide the emitted electrons in an axis direction in general. The magnetic flux formed by the convergent coil extends from an outlet side of the convergent coil in an axis direction, turns over outwardly, and returns to an inlet side of the convergent coil. The magnetic flux which turns over outwardly could partially penetrate the vapor deposition target body or pass through a vicinity of the vapor deposition target body. Since the plasma moves along with the magnetic flux, in the conventional vapor deposition apparatus, the plasma is slightly guided to the vicinity of the vapor deposition target body. Therefore, in the conventional vapor deposition apparatus, it is difficult to completely separate the vapor deposition target body from the plasma, and the plasma could damage the surface of the vapor deposition target body due to the bombardment effect.

JP 4-329637 A discloses the invention in which, in an ion sputtering apparatus for coating a processing target with a material sputtered by plasma gas, a pair of coils for forming a repelling magnetic flux across the processing target is provided, and a positional relationship between a cusp surface on which the magnetic flux of both coils are canceled and the processing target is adjusted to control a speed of ion sputtering (bombardment). According to this invention, the plasma is guided toward the processing target basically, so that the strength of the sputtering can be adjusted, but it is impossible to separate the processing target from the plasma and completely prevent the sputtering.

SUMMARY OF THE INVENTION

In view of the above problems, an object of the present invention is to provide a plasma processing apparatus capable of bringing plasma close to or into contact with a processing target, and separating the plasma from the processing target.

In order to solve the above problems, a plasma processing apparatus according to the present invention includes a chamber internally having a holding space in which a processing target is held, and a plasma space in which plasma is to be formed, a plasma gun for emitting electrons into the plasma space to form the plasma, and at least one pair of opposed magnets for forming a magnetic flux passing through the chamber, between the holding space and the plasma space.

According to this configuration, a magnetic field of the opposed magnets traps a magnetic flux of the plasma gun and prevents the magnetic flux of the plasma gun from approaching the processing target. That is, the linear magnetic field formed by the opposed magnets traps ions and charged particles which try to approach from the plasma space to the holding space, so that it can prevent the plasma from coming in contact with the processing target and damaging it. In addition, an amount of leakage of the plasma to the holding space is determined based on a trapping ability of the opposed magnets, so that a degree of the bombardment effect can be adjusted by the trapping ability of the opposed magnets.

In addition, according to the plasma processing apparatus in the present invention, positions of the opposed magnets may be adjustable.

According to this configuration, a boundary position of the plasma space in which the plasma is substantially confined can be changed. Especially, by changing heights of the opposed magnets independently, a shielding ability for the plasma can be adjusted based on asymmetry properties of the plasma gun and the chamber, so that each of an amount of neutral particles approaching the holding space and an amount of leaked plasma can be made uniform.

In addition, according to the plasma processing apparatus in the present invention may further include an electromagnetic shield for shielding the magnetic flux, in a portion around the holding space of the chamber.

According to this configuration, the electromagnetic shield can guide the magnetic flux in a direction opposite to the linear magnetic field formed by the opposed magnets and prevent the magnetic flux from passing through the holding region.

In addition, according to the plasma processing apparatus in the present invention, the opposed magnets may include electromagnets and may adjust an excitation current.

According to this configuration, the amount of leakage of the plasma to the holding space can be easily controlled.

In addition, according to the plasma processing apparatus in the present invention, the opposed magnets may include a plurality of pairs of magnets.

According to this configuration, the opposed magnets form the linear magnetic fields passing through the chamber so as to be aligned side by side in planar view, so that the plasma can be sealed by the surface.

As described above, according to the present invention, by forming the linear magnetic field between the processing target and the plasma, the amount of the plasma reaching the processing target can be controlled, and the bombardment can be prevented.

DETAILED DESCRIPTION OF THE PREFERRED EMBODIMENT

Figure 1:
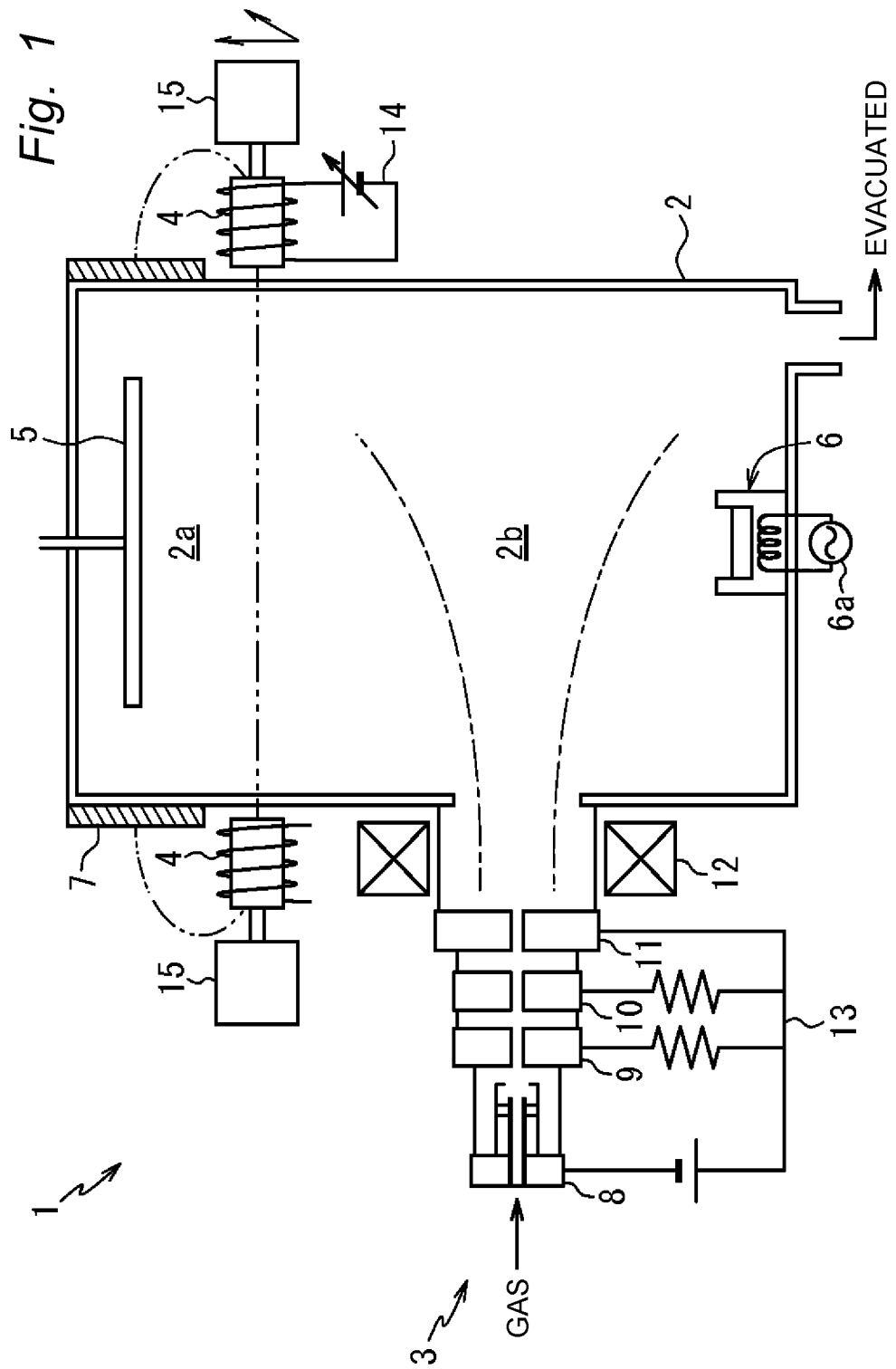
FIG. 1 is a schematic configuration diagram of a plasma vapor deposition apparatus according to one embodiment of the present invention.

FIG. 1 shows a configuration of a plasma vapor deposition apparatus 1 in one embodiment of a plasma processing apparatus according to the present invention. The plasma vapor deposition apparatus 1 has a chamber 2, a plasma gun 3, and opposed magnets 4.

The chamber 2 internally includes a holding space 2a in which a glass substrate 5 serving as a processing target is held, and a plasma space 2b in which plasma is to be formed by the plasma gun 3. A crucible 6 including an electric heater 6a for melting a vapor deposition material is arranged in a bottom portion of the plasma space 2b. In addition, an electromagnetic shield 7 made of ferromagnetic material is arranged on an outside of the chamber 2 so as to surround an outer periphery of the holding space 2a. In addition, the chamber 2 is connected to a vacuum pump (not shown) so that the inside of the chamber can be evacuated.

The plasma gun 3 is arranged so as to face the plasma space 2b through an opening provided on a sidewall of the chamber 2. This plasma gun 3 has a cathode 8 for emitting electrons, a first electrode 9 and a second electrode 10 for forming potential gradients along an electron orbit, a feedback electrode 11 for collecting the electrons emitted from the cathode 8, and a convergent coil 12 for forming a magnetic flux for guiding the electrons emitted from the cathode 8 as shown by a one-dot chain line. In addition, the plasma gun 3 has a drive circuit 13 for applying a discharge voltage to each of the cathode 8, the first electrode 9, the second electrode 10, and the feedback electrode 11. This plasma gun 3 ejects a discharge gas which is ionized to be plasma, such as argon, along centers of the cathode 8, the first electrode 9, the second electrode 10, the feedback electrode 11, and the convergent coil 12.

The opposed magnets 4 are arranged outside the chamber 2 so as to be opposed to each other, and an excitation current by which opposed magnetic poles show opposite polarities is applied from an excitation circuit 14. Thus, as shown by a two-dot chain line, the opposed magnets 4 form a linear magnetic field in which the magnetic flux linearly extends between the holding space 2a and the plasma space 2b across the chamber 2. In addition, each of the opposed magnets 4 is supported by a position adjusting mechanism 15, and the position of the magnet can be adjusted in a vertical direction and a depth direction in sheet surface, independently.

Figure 2:
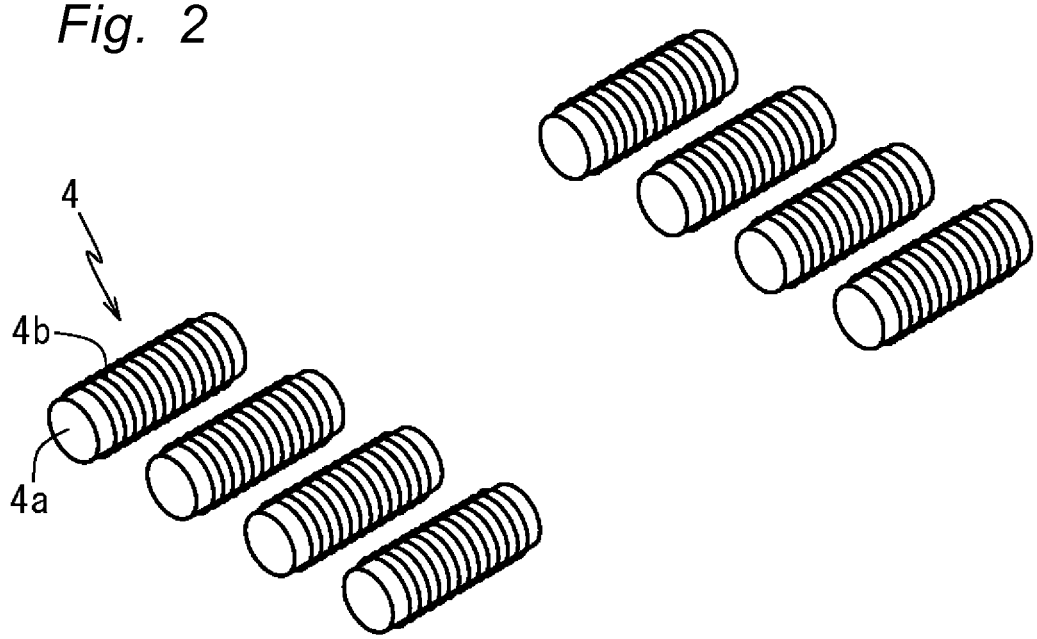
FIG. 2 is a perspective view of opposed magnets of FIG. 1.

In addition, as shown in FIG. 2, each of the opposed magnets 4 in this embodiment is composed of an electromagnet which is provided in such a manner that an electric wire 4b is wound around a column-shaped core 4a, and a plurality of pairs are arranged so as to be aligned in almost a horizontal direction. Thus, the opposed magnets 4 can form almost uniform linear magnetic fields over a whole cross-sectional surface of the chamber 2 in almost the horizontal direction. In addition, the linear magnetic field can be inclined or bent by adjusting the position of each of the opposed magnets 4 with the position adjusting mechanism 15.

In addition, as shown by a two-dot chain line, each of the opposed magnets 4 generates a magnetic flux from a magnetic pole positioned on the outer side, but the magnetic flux to the holding space 2a among the magnetic flux is trapped by the electromagnetic shield 7 made of the ferromagnetic material, and goes around the electromagnetic shield 7, so that the flux does not pass through the holding space 2a in the chamber 2.

Therefore, as for the electromagnetic shield 7, the material and shape are selected so that magnetic saturation does not occur by the magnetic flux formed by the opposed magnets 4. In addition, the electromagnetic shield 7 may be formed so as to cover not only the outer periphery of the chamber 2 but also an upper portion of the chamber 2.

In the plasma vapor deposition apparatus 1, when plasma is formed in the plasma space 2b by the plasma gun 3 under the condition that the excitation current is not applied to the opposed magnets 4, the plasma enters the holding space 2a and comes in contact with the glass substrate 5. Therefore, a foreign material on a surface of the glass substrate 5 can be removed (cleaned) by the bombardment effect provided due to the contact of the plasma.

Then, when the excitation current is applied to the opposed magnets 4, the magnetic flux is formed so as to linearly extend from the one of the opposed magnets 4 to the other of the opposed magnets 4. In addition, the one of the opposed magnets 4 takes in and traps the magnetic flux of the convergent coil 12 which has passed through the holding space 2a since the excitation current was not applied.

The electrons, ions, and charged particles in the plasma discharged from the plasma gun 3 and existing in the plasma space 2b must pass through the linear magnetic field formed by the opposed magnets 4 to enter the holding space 2a. However, the charges or magnetized particles are attracted to the linear magnetic field formed by the opposed magnets 4, and moved toward the sidewall of the chamber 2. Thus, the plasma cannot enter the holding space 2a and the plasma is not newly formed in the holding space 2a.

When the vapor deposition material in the crucible 6 is evaporated in this state, the vapor deposition material mainly composed of electromagnetically neutral particles enter the holding space 2a, and a vapor deposition film is formed on the cleaned surface of the glass substrate 5. Thus, the vapor deposition film is grown on the surface of the glass substrate 5 under the condition that the plasma is sealed in the plasma space 2b due to the linear magnetic field formed by the opposed magnets 4, so that the plasma is not in contact with the vapor deposition film, and the damage of the vapor deposition film due to the bombardment effect is not generated.

As a matter of course, in the plasma vapor deposition apparatus 1, the excitation current to the opposed magnets 4 may be interrupted or reduced intentionally for cleaning by use of the bombardment effect at a certain time between the vapor depositions.

In addition, in the plasma vapor deposition apparatus 1, by adjusting the position of the opposed magnets 4 with the position adjusting mechanism 15 so as to incline and bend the linear magnetic field or differentiate a magnetic flux density of the linear magnetic field on a central axis of the plasma gun 3 from that on the side thereof, it is possible to compensate plasma asymmetry generated due to a distribution of the magnetic field formed by the convergent coil 12 of the plasma gun 3, a flow of the discharge gas or electrons, or the like, so that uniformity of the vapor deposition film can be improved.

Figure 3:
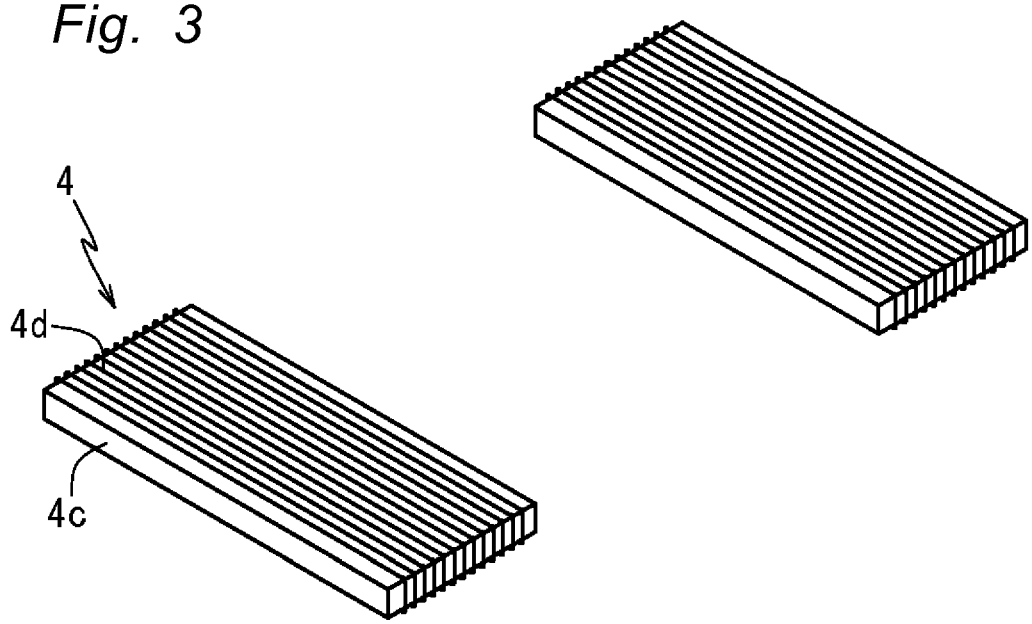
FIG. 3 is a perspective view of alternative of the opposed magnets of FIG. 2.

As shown in FIG. 3, in the present invention, the linear magnetic field may be formed with the opposed magnets 4 which are provided in such a manner that electric wires 4d are wound around a pair of plate-shaped cores 4c. In addition, the opposed magnets 4 may be composed of permanent magnets. In addition, according to the present invention, a direction of the linear magnetic field formed by the opposed magnets 4 may not be parallel to the axis of the plasma gun 3. Furthermore, since the plasma gun 3 can generate the high-density plasma in the vicinity of its central axis, the one pair or the plurality of pairs of opposed magnets 4 may be arranged only in an upper part of the central axis of the plasma gun 3 or the vicinity of the axis.

In the embodiment shown in FIG. 1, the vapor deposition material in the crucible 6 is evaporated by the electric heater 6a, but the vapor deposition material may be evaporated by the plasma generated by the plasma gun 3.

What is claimed is:
1. A plasma processing apparatus comprising:
   a chamber internally having a holding space in which a processing target is held, and a plasma space in which plasma is to be formed;

the holding space and the plasma space are arranged in one arrangement direction;

a plasma gun for emitting electrons from a direction perpendicular to the arrangement direction into the plasma space to form the plasma, the plasma gun having a convergent coil; and at least one pair of opposed magnets for forming a magnetic flux passing through the chamber, between the holding space and the plasma space, the pair of opposed magnets being positioned between the convergent coil of the plasma gun and the processing target so that opposite polarities of the pair of opposed magnets are opposed to each other.

2. The plasma processing apparatus according to claim 1, wherein positions of the opposed magnets are adjustable.

3. The plasma processing apparatus according to claim 2, further comprising:

an electromagnetic shield for shielding the magnetic flux, in a portion around the holding space of the chamber.

4. The plasma processing apparatus according to claim 2, wherein the opposed magnets include electromagnets and adjust an excitation current.

5. The plasma processing apparatus according to claim 2, wherein the opposed magnets include a plurality of pairs of magnets.

6. The plasma processing apparatus according to claim 1, further comprising:

an electromagnetic shield for shielding the magnetic flux, in a portion around the holding space of the chamber.

7. The plasma processing apparatus according to claim 6, wherein the opposed magnets include electromagnets and adjust an excitation current.

8. The plasma processing apparatus according to claim 6, wherein the opposed magnets include a plurality of pairs of magnets.

9. The plasma processing apparatus according to claim 1, wherein the opposed magnets include electromagnets and adjust an excitation current.

10. The plasma processing apparatus according to claim 9, wherein the opposed magnets include a plurality of pairs of magnets.

11. The plasma processing apparatus according to claim 1, wherein the opposed magnets include a plurality of pairs of magnets.

* * * * *